United States Patent
Iwashita et al.

(10) Patent No.: US 6,720,846 B2
(45) Date of Patent: Apr. 13, 2004

(54) SURFACE ACOUSTIC WAVE DEVICE WITH KNBO3 PIEZOELECTRIC THIN FILM, FREQUENCY FILTER, OSCILLATOR, ELECTRONIC CIRCUIT, AND ELECTRONIC APPARATUS

(75) Inventors: Setsuya Iwashita, Nirasaki (JP); Takamitsu Higuchi, Matsumoto (JP); Hiromu Miyazawa, Nagano-ken (JP)

(73) Assignee: Seiko Epson Corporation (JP)

( * ) Notice: Subject to any disclaimer, the term of this patent is extended or adjusted under 35 U.S.C. 154(b) by 2 days.

(21) Appl. No.: 10/102,181

(22) Filed: Mar. 20, 2002

(65) Prior Publication Data

US 2002/0145488 A1 Oct. 10, 2002

(30) Foreign Application Priority Data

| Mar. 21, 2001 | (JP) | ........................ | 2001-081349 |
| Mar. 21, 2001 | (JP) | ........................ | 2001-081350 |
| Mar. 15, 2002 | (JP) | ........................ | 2002-073090 |

(51) Int. Cl.[7] .......................... H03H 9/64; H03H 9/25; H03B 5/32
(52) U.S. Cl. ................. 333/193; 333/150; 333/133; 331/107 A; 331/155; 310/313 A; 310/313 B
(58) Field of Search ................... 333/150–155, 333/193–196, 133; 331/107 A, 155; 310/313 R, 313 A, 313 B, 313 C, 313 D

(56) References Cited

U.S. PATENT DOCUMENTS 5,874,866 A  2/1999  Satoh et al. ............ 331/107 A
6,538,359 B1  3/2003  Hiraku et al. .......... 310/313 R

FOREIGN PATENT DOCUMENTS

| JP | 10-065488   | 3/1998  |
| JP | 2000-278084 | 10/2000 |
| JP | 2001-196892 | 7/2001  |
| JP | 2001-285018 | 10/2001 |
| JP | 2001-285019 | 10/2001 |

OTHER PUBLICATIONS

Yamanouchi, et al, "Theoretical and Experimental Study of Super–High Electromechanical Coupling Surface Acoustic Wave Propagation in KNbO3Single Crystal," Electronics Letters, Jan. 30, 1997, vol. 33, No. 3, pp. 193–194.

Primary Examiner—Barbara Summons
(74) Attorney, Agent, or Firm—Harness, Dickey & Pierce, P.L.C.

(57) ABSTRACT

Surface acoustic wave device having a high $k^2$, and a frequency filter, oscillator, electronic circuit and electronic device employing this surface acoustic wave device is provided, wherein a first oxide thin film layer comprising SrO or MgO and a second oxide thin film layer comprising $SrTiO_3$ are sequentially formed on top of a (110) Si substrate, or a first oxide thin film layer comprising $CeO_2$, $ZrO_2$ or yttrium-stabilized zirconia and a second oxide thin film layer comprising $SrTiO_3$ are sequentially formed on top of a (100) Si substrate, a $KNbO_3$ piezoelectric thin film being then formed on top of either of these second oxide thin film layers, and then, a protective film comprising oxide or nitride is formed on top of the $KNbO_3$ piezoelectric thin film, finally, at least one electrode is formed on top of this protective film, to form a surface acoustic wave device, which surface acoustic wave device is employed to form a frequency filter, oscillator, electronic circuit, or electronic device.

17 Claims, 6 Drawing Sheets

SURFACE ACOUSTIC WAVE DEVICE WITH KNB03 PIEZOELECTRIC THIN FILM, FREQUENCY FILTER, OSCILLATOR, ELECTRONIC CIRCUIT, AND ELECTRONIC APPARATUS

BACKGROUND OF THE INVENTION

1. Field of the Invention

The present invention relates to a surface acoustic wave device having a piezoelectric thin film, a frequency filter, a oscillator, an electronic circuit and an electronic apparatus, and more specifically, to a surface acoustic wave device having a silicon substrate and a potassium niobate piezoelectric thin film, a frequency filter, a oscillator, an electronic circuit, and an electronic apparatus, which are employed in the telecommunications field.

2. Description of the Related Art

Surface acoustic wave devices employing a piezoelectric material with a high electromechanical coupling coefficient (denoted as "$k^2$" hereinafter) have been desired in order to improve the performance of non-lead containing surface acoustic wave devices. Lithium niobate is known conventionally as a material with a high $k^2$, demonstrating a $k^2$ of 5.5% using Rayleigh waves. However, it has been shown that $k^2$ can exceed 50% with potassium niobate ("$KNbO_3$" hereinafter), as disclosed in *Electronics Letters*, Vol. 33, No. 3 (1997), p. 193, and much attention has been focused on this area in recent years. In addition, research has been conducted into surface acoustic wave devices employing a $KNbO_3$ thin film, such as disclosed in Japanese Unexamined Patent Application, First Publication No. 10-65488.

However, conventional surface acoustic wave devices have the following problems.

Namely, it is difficult to produce high quality, large $KNbO_3$ single crystals in a surface acoustic wave device that uses a $KNbO_3$ single crystal. As a result, this is not practical from the perspective of mass production. On the other hand, in a surface acoustic wave device employing a $KNbO_3$ thin film, acoustic velocity, $k^2$ and other such characteristics depend on the $KNbO_3$ crystal orientation. Thus, the orientation of the $KNbO_3$ thin film must be controlled. As disclosed in Japanese Unexamined Patent Application, First Publication No. 2000-278084, it is known that a $KNbO_3$ (010) epitaxial film can be obtained by using a (110) oriented substrate of strontium titanate ($SrTiO_3$ hereinafter). This indexing assumes that the b axis lattice constant is the largest. However, even if the orientation of the $KNbO_3$ thin film can be controlled using a $SrTiO_3$ substrate, it is difficult to form a $SrTiO_3$ substrate which is larger than two inches. Accordingly, this also is not suitable from the perspective of mass production. Furthermore, even if such a substrate could be produced hypothetically, it is not viewed to be practical in terms of cost.

A silicon (denoted as "Si" hereinafter) substrate would appear promising from the perspective of cost and capacity for mass production. Still, it is difficult to obtain a high-quality epitaxial thin film even when the $KNbO_3$ thin film is formed directly on top of the Si substrate, because of lattice mismatches and the like. As a result, a high $k^2$ cannot be obtained.

SUMMARY OF THE INVENTION

It is the objective of the present invention to resolve the above-described problems by providing a surface acoustic wave device having a high $k^2$, which element is manufactured by employing a Si substrate that is advantageous in terms of cost and capacity for mass production, wherein a high quality $KNbO_3$ epitaxial thin film is formed onto the Si substrate.

The first aspect of the present invention is a surface acoustic wave device having a (110) silicon substrate, and a (010) potassium niobate piezoelectric thin film. This surface acoustic wave device has a first oxide thin film layer formed on top of the silicon substrate, a second oxide thin film layer formed on the first oxide thin film layer, a potassium niobate piezoelectric thin film formed on top of the second oxide thin film layer, and a protective thin film comprising an oxide or nitride formed onto the potassium niobate piezoelectric thin film.

As a result of the above design, the first oxide thin film layer and the second oxide thin film layer can be made to undergo epitaxial growth in sequence on top of the silicon substrate. A high quality $KNbO_3$ epitaxial thin film can then be formed on top of the aforementioned layers. Specifically, it becomes an easy matter to form a (010) $KNbO_3$ epitaxial thin film, making it possible to provide a surface acoustic wave device having a high $k^2$ which is advantageous with respect to cost and capacity for mass production.

The first oxide thin film layer is preferably formed from strontium oxide (denoted as "SrO" hereinafter) or magnesium oxide (denoted as "MgO" hereinafter). These first oxide thin films are capable of epitaxial growth on top of the (110) silicon substrate, ultimately enabling epitaxial growth of $KNbO_3$. Specifically, a (010) oriented $KNbO_3$ is easily formed.

The second oxide thin film is preferably formed of $SrTiO_3$.

$SrTiO_3$ is capable of epitaxial growth on the aforementioned first oxide thin film, and enables epitaxial growth of $KNbO_3$ on the $SrTiO_3$ film. Specifically, a (010) oriented $KNbO_3$ is easily formed.

The second aspect of the present invention is a surface acoustic wave device having a (100) silicon substrate and a (010) $KNbO_3$ piezoelectric thin film. This surface acoustic wave device has a first oxide thin film layer formed on top of the silicon substrate, a second oxide thin film layer formed on top of the first oxide thin film layer, a $KNbO_3$ piezoelectric thin film formed on top of the second oxide thin film layer, and a protective thin film comprising an oxide or nitride formed on top of the $KNbO_3$ piezoelectric thin film.

As a result of the above design, the first oxide thin film layer and the second oxide thin film layer can be made to undergo epitaxial growth in sequence on top of the silicon substrate, and a high quality $KNbO_3$ epitaxial thin film can then be formed on top of these layers. In particular, formation of a (010) $KNbO_3$ epitaxial thin film becomes an easy matter, making it possible to provide a surface acoustic wave device having a high $k^2$ which is advantageous with respect to cost and capacity for mass production.

The first oxide thin film layer is preferably formed from cerium oxide (denoted by "$CeO_2$" hereinafter), zirconium oxide (denoted as "$ZrO_2$" hereinafter), or yttrium-stabilized zirconia (denoted as "YSZ" hereinafter).

These first oxide thin films are capable of epitaxial growth on a (100) silicon substrate, so that epitaxial growth of $KNbO_3$, and (010) $KNbO_3$ in particular, is made possible in the end.

The second oxide thin film layer is preferably formed from strontium titanate (denoted as "$SrTiO_3$" hereinafter).

SrTiO$_3$ is capable of epitaxial growth on the first oxide, and enables epitaxial growth of KNbO$_3$, and (010) KNbO$_3$ in particular, on the SrTiO$_3$ film.

The second aspect is preferred over the first aspect in that, during formation of the oxide layer, a relatively high-temperature, high-vacuum is not required, and because a (100) silicon substrate is more readily available and less expensive than a (110) silicon substrate.

In the present invention's surface acoustic wave device, an electrode is formed on top of the piezoelectric thin film or the protective thin film. However, when providing an electrode on top of the piezoelectric thin film, there is some concern that the piezoelectric thin film may be degraded by water or the like during the electrode forming process. Further, when forming the protective thin film on top of the piezoelectric thin film and the electrode, it is necessary to take out the electrode through the protective thin film. As a result, formation of the frequency filter becomes troublesome and costs rise. Accordingly, it is preferable that the electrode be formed on top of the protective thin film.

This is also true of the frequency filter and the oscillator that will be described below.

The third aspect of the present invention is a frequency filter characterized in the provision to any one of the above described surface acoustic wave devices of a first electrode, which is formed on top of the protective thin film or the piezoelectric thin film; and a second electrode, which is formed on top of the protective thin film or the piezoelectric thin film; the second electrode resonating at a specific frequency or at a specific band frequency of the surface acoustic waves that are produced in the piezoelectric thin film from an electric signal impressed by the first electrode, and converting this resonance to an electric signal.

Due to the high k$^2$ provided by this design, it is possible to provide a frequency filter having a broad relative bandwidth.

The fourth aspect of the present invention is a oscillator characterized in the provision to any one of the above described surface acoustic wave devices of an electric signal impressing electrode, which is formed on top of the protective thin film or the piezoelectric thin film and which generates a surface acoustic wave on the piezoelectric thin film from the impressed electric signal; and a resonating electrode, which is formed on top of the protective thin film or the piezoelectric thin film and which resonates a specific frequency or specific band frequency of the surface acoustic waves that are generated by the electric signal impressing electrode.

Due to the high k$^2$ of the surface acoustic wave device's piezoelectric thin film in this design, it is possible to eliminate the expander coil. Thus, a oscillator having a simple Circuit structure can be provided. Moreover, integration with an IC becomes possible, so that a small-sized, high functioning oscillator can be provided.

The fifth aspect of the present invention is an electronic circuit characterized in the provision of the above described oscillator and an electric signal supplying element for impressing an electric signal on the electric signal impressing electrode provided in the oscillator; wherein the electronic circuit selects specific frequencies from the frequencies of the electric signal or converts the electric signal to specific frequencies, or applies specific modulation to the electric signal and carries out specific demodulation or specific wave detection.

As a result of this design, the k$^2$ of the piezoelectric thin film forming the surface acoustic wave device that is proved in the electronic circuit's oscillator is high, and integration with an IC is possible. Thus, a small-sized, high-functioning electronic circuit can be provided. The sixth aspect of the present invention is an electronic device characterized in including at least one of the above-described frequency filter, oscillator, and electronic circuit. The k$^2$ of the piezoelectric thin film in the electronic device is high in this design. As a result, it is possible to offer a small-sized, high-functioning electronic device.

BRIEF DESCRIPTION OF THE DRAWINGS

FIG. 5($a$) is a transparent view as seen from the side, and FIG. 5($b$) is a transparent view as seen from above.

PREFERRED EMBODIMENTS OF THE PRESENT INVENTION

The present invention will now be explained in detail using preferred embodiments.

Embodiment 1

Figure 1:
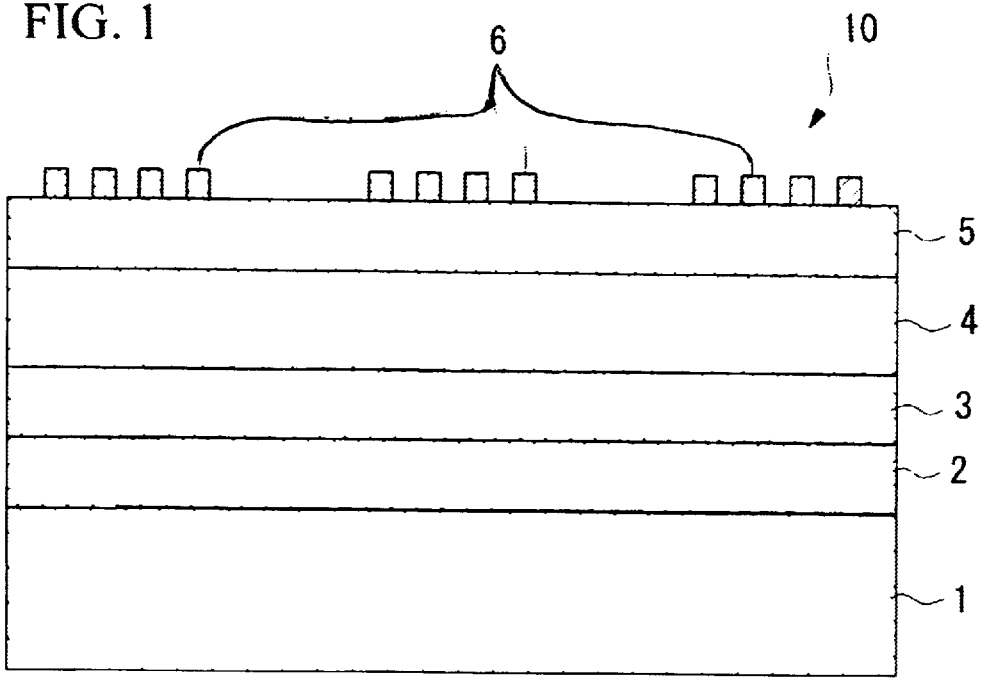
FIG. 1 is a view showing the cross-sectional structure of the surface acoustic wave device according to the first embodiment of the present invention.
Figure 3:
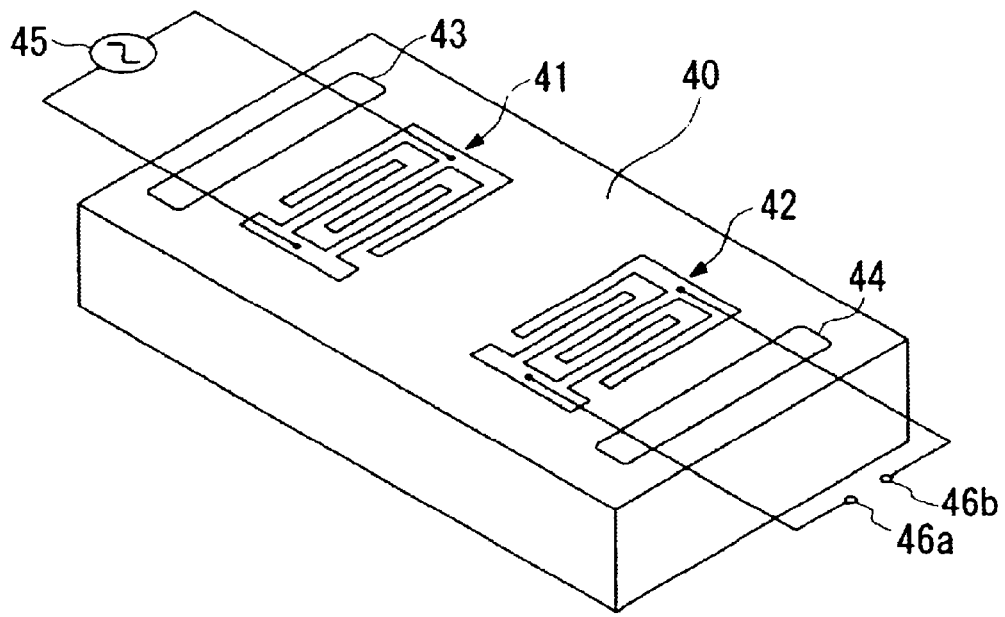
FIG. 3 is a perspective view showing the external appearance of the frequency filter according to the third embodiment of the present invention.
Figure 4:
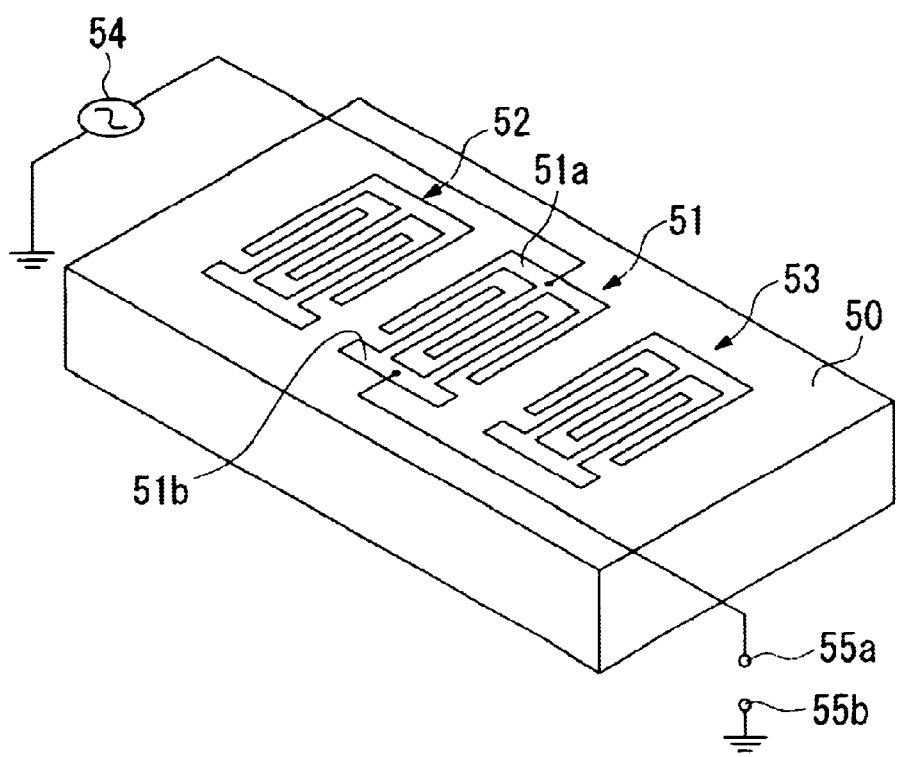
FIG. 4 is a perspective view showing the external appearance of the oscillator according to an embodiment of the present invention.

FIG. 1 is a view showing the cross-sectional structure of the surface acoustic wave device according to the first embodiment of the present invention. This surface acoustic wave device is formed of a Si substrate 1, a first oxide thin film layer 2, a second oxide thin film layer 3, a potassium niobate thin film (KNbO$_3$ thin film) 4, a thin film 5 comprising an oxide or nitride as a protective layer, and electrodes 6. When viewed from above, these electrodes 6 are shaped like IDT electrodes 41, 42, 51, 52, 53 as shown in FIGS. 3 and 4, for example.

The process for forming the surface acoustic wave device of this embodiment consisting of the above-described structure will now be specifically shown. First, a strontium oxide (denoted as "SrO" hereinafter) thin film is formed using a laser ablation method on top of Si (110) single crystal substrate 1 to serve as first oxide thin film layer 2. Film formation was carried out at a substrate temperature of 700° C. in oxygenated plasma at 1.3×10$^{-5}$ Pa (10$^{-7}$ Torr), to form a (110) oriented SrO thin film on top of a Si (110) substrate. The in-plane orientation of the SrO thin film was investigated using an X-ray diffraction pole figure, and was confirmed. In other words, it was confirmed that the (110) oriented SrO thin film had undergone epitaxial growth on the Si (110) substrate.

This orientation relationship is thought to depend on the relationship between the crystal lattices of Si and SrO. In addition, note that the vacuum pressure and the substrate temperature are not limited to the above values. SrO is vulnerable to water, so that damage can occur during patterning of electrode 6. Thus, it is necessary to form SrO to be as thin as possible.

Next, a $SrTiO_3$ thin film which serves as the second oxide thin film layer 3 is formed on top of the SrO thin film which serves as the first oxide thin film layer 2 using the same laser ablation method. Note that a plurality of targets can attach to the laser ablation device, so that a number of different materials can be formed into films in a continuous manner. The film was formed at a substrate temperature of 600° C. in oxygenated plasma at 0.013 Pa ($10^{-4}$ Torr), and epitaxial growth of a (110) oriented $SrTiO_3$ thin film on a (110) oriented SrO thin film was confirmed. This orientation relationship is also believed to depend on the relationship of the lattice constant and the crystal lattice between SrO and a perovskite type $SrTiO_3$.

Next, the same laser ablation method is employed to continuously form a $KNbO_3$ thin film 4 which serves as the piezoelectric material on top of the $SrTiO_3$ thin film of the second oxide thin film layer 3. Since the K is easily vaporized in this case, the target composition is preferably enriched in K. The film was formed at a substrate temperature of 600° C. in oxygenated plasma at 0.013 Pa ($10^{-4}$ Torr), and it was confirmed that a (010) oriented $KNbO_3$ thin film 4 had undergone epitaxial growth onto a (110) oriented $SrTiO_3$ epitaxial thin film. The thickness of this $KNbO_3$ thin film 4 was 1 $\mu$m. $SrTiO_3$ and $KNbO_3$ have the same perovskite structure, and their orientation relationship is dependent on the relationship between their lattice constants, as in the case of the invention disclosed in Japanese Unexamined Patent Application, First Publication No. 10-65488.

As described above, the SrO thin film as the first oxide thin film layer and the $SrTiO_3$ thin film as the second oxide thin film layer can be made to each undergo (110) and (110) oriented epitaxial growth respectively on top of (110) Si substrate 1. Further, by giving the $SrTiO_3$ thin film a (110) orientation, the $KNbO_3$ thin film 4 that is formed onto this film can be made to undergo epitaxial growth in the (010) orientation. The <010> direction of the $KNbO_3$ is the direction of the polarization axis.

Note it is difficult to form an $SrTiO_3$ epitaxial thin film in the case where the $SrTiO_3$ thin film is formed directly onto the Si substrate, because the mutual crystal structures and lattice constants differ and because counter diffusion occurs. In other words, by forming a SrO thin film in between the (110) Si substrate and the $SrTiO_3$ thin film, it becomes possible for the first time to produce a $SrTiO_3$ epitaxial thin film and, moreover, to improve the quality of the $KNbO_3$ thin film formed on top of this layer.

Next, the same laser ablation method is used to continuously form a $SiO_2$ amorphous thin film to serve as thin film 5, comprising the oxide or nitride of the protective layer, on top of $KNbO_3$ thin film 4. Since the K in $KNbO_3$ readily reacts with water, it can change over time. It is therefore desirable that a protective layer be present. In addition, the $SiO_2$ also functions to control the temperature characteristics since the sign of its temperature coefficient is opposite that of $KNbO_3$. Examples of other materials that can perform the same function as $SiO_2$ include aluminum nitride (AlN).

Accordingly, an AlN thin film may also be used as the protective layer.

Finally, an aluminum thin film is formed on top of $SiO_2$, and patterning is carried out to form electrodes 6, thereby producing surface acoustic wave device 10.

When the characteristics of the surface acoustic wave device produced by the above-described method was evaluated, a $k^2$ of 10% or more was obtained with good repeatability. However, the value of $k^2$ depends on the quality and film thickness of the $KNbO_3$ thin film 4. For this reason, the film forming technique and the film thickness must be correct for obtaining a high quality film including the first oxide thin film layer 2 and the second oxide thin film layer 3.

Note that while an SrO thin film was employed for first oxide thin film layer 2 here, it is equally effective to employ an MgO thin film.

Embodiment 2

Figure 2:
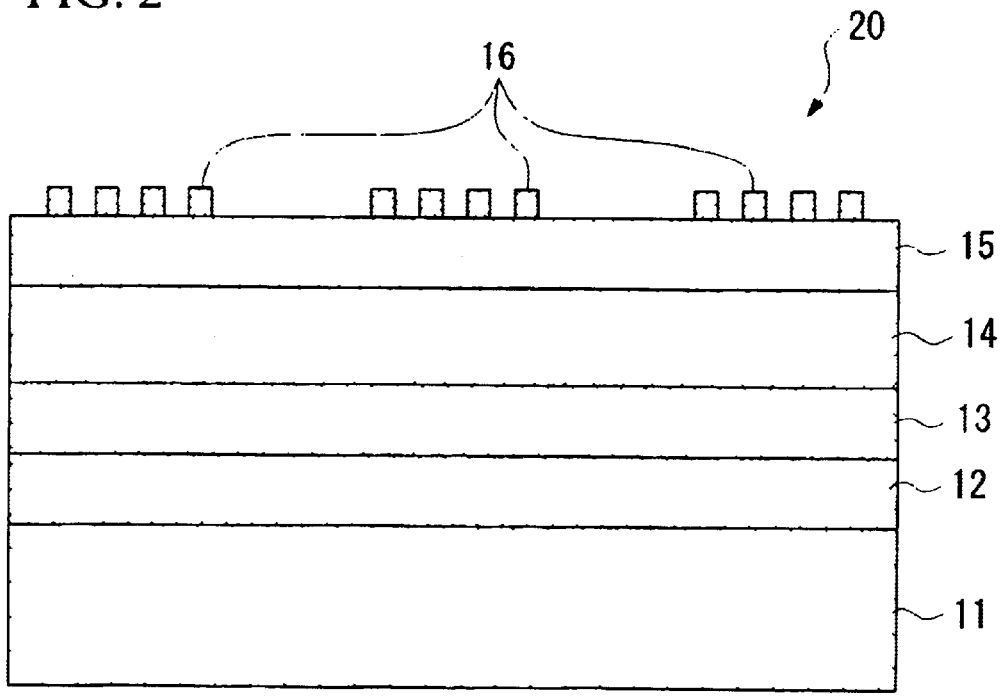
FIG. 2 is a view showing the cross-sectional structure of the surface acoustic wave device according to the second embodiment of the present invention.

FIG. 2 is a view showing the cross-sectional structure of the surface acoustic wave device according to the second embodiment of the present invention. This surface acoustic wave device is formed of a Si substrate 11, a first oxide thin film layer 12, a second oxide thin film layer 13, $KNbO_3$ thin film 14, a thin film 15 comprising an oxide or nitride as a protective layer, and electrodes 16. When viewed from above, electrodes 16 are shaped like IDT electrodes 41, 42, 51, 52, and 53 as shown in FIGS. 3 and 4, for example.

The process for forming a surface acoustic wave device according to this embodiment consisting of the above-described structure will be specifically shown. First, a celium oxide (denoted as "$CeO_2$" hereinafter) thin film is formed using a laser ablation method on top of a Si (100) single crystal substrate 11 as the first oxide thin film layer 12. Film formation was performed at a substrate temperature of 500° C. in oxygenated plasma at $1.3 \times 10^{-5}$ Pa ($10^{-7}$ Torr), to form a (100) oriented $CeO_2$ thin film on top of a Si (100) substrate. In-plane orientation was confirmed by investigating the in-plane orientation of the $CeO_2$ thin film using an X-ray diffraction pole figure. Namely, it was confirmed that a (100) oriented $CeO_2$ thin film had undergone epitaxial growth on top of the Si (100) substrate.

Next, the same laser ablation method was used to form the $SrTiO_3$ thin film which serves as second oxide thin film layer 13 on top of the $CeO_2$ thin film which serves as the first oxide thin film layer 12. Note that some kind of targets can be attached to the laser ablation machine, so that a number of different materials can be formed into thin films in a continuous manner. After carrying out film formation at a substrate temperature of 600° C. in oxygenated plasma at $10^{-4}$ Torr, it was confirmed that an (110) oriented $SrTiO_3$ thin film undergoes epitaxial growth on a (100) oriented $CeO_2$ thin film. This orientation relationship is believed to depend on the relationship of the lattice constant and the crystal lattice between fluorite type $CeO_2$ and the perovskite type $SrTiO_3$.

Next, the same laser ablation method was employed to continuously form a $KNbO_3$ thin film 14 which serves as the piezoelectric material, on top of the $SrTiO_3$ thin film which serves as second oxide thin film layer 13. Since K is easily vaporized during this process, it is acceptable to enrich the target composition in potassium. After carrying out film formation at a substrate temperature of 600° C. in oxygenated plasma at $10^{-4}$ Torr, it was confirmed that a (010) oriented $KNbO_3$ thin film 14 had undergone epitaxial growth on top of the (110) oriented $SrTiO_3$ epitaxial thin film. The thickness of this $KNbO_3$ thin film 14 was 1 $\mu$m. $SrTiO_3$ and $KNbO_3$ have the same perovskite type structure.

The orientation relationship is based on the relationship between lattice constants, and is equivalent to that disclosed in Japanese Unexamined Patent Application, First Publication No. 10-65488.

As described above, the $CeO_2$ thin film of the first oxide thin film layer and the $SrTiO_3$ thin film of the second oxide thin film layer can be made to each undergo, respectively, (100) and (110) oriented epitaxial growth on top of (100) Si substrate 11. Further, by giving the $SrTiO_3$ thin film a (110) orientation, the $KNbO_3$ thin film 14 that is formed on top of this film can be made to undergo epitaxial growth with a (010) orientation.

The <010> direction of the $KNbO_3$ is the direction of the polarization axis. Note it is difficult to form an $SrTiO_3$ epitaxial thin film in the case where the $SrTiO_3$ thin film is formed directly onto the Si substrate, because the mutual crystal structures and lattice constants differ and because counter diffusion occurs. In other words, by forming a $CeO_2$ thin film in between the Si substrate and the $SrTiO_3$ thin film, it becomes possible for the first time to produce a $SrTiO_3$ epitaxial thin film and, moreover, to improve the quality of the $KNbO_3$ thin film formed on top of this layer.

Next, the same laser ablation method is used to continuously form a $SiO_2$ amorphous thin film to serve as thin film 15, comprising the oxide or nitride of the protective layer, on top of $KNbO_3$ thin film 14. Since the K in $KNbO_3$ readily reacts with water, it can change over time. It is therefore desirable that a protective layer be present. In addition, the $SiO_2$ also functions to control the temperature characteristics since the sign of its temperature coefficient is opposite that of $KNbO_3$. Examples of other materials that can perform the same function as $SiO_2$ include aluminum nitride (AlN). Accordingly, an AlN thin film may also be used as the protective layer Finally, an aluminum thin film is formed onto $SiO_2$, and patterning is carried out to form electrodes 16, thereby producing the surface acoustic wave device 20.

When the characteristics of the surface acoustic wave device produced by the above-described method were evaluated, a $k^2$ of 10% or more was obtained with good repeatability. However, the value of $k^2$ depends on the quality and thickness of $KNbO_3$ thin film 14. For this reason, the correct film forming technique and film thickness are needed for obtaining a high quality film including first oxide film thin film layer 12 and the second oxide thin film layer 13.

Note that while a $CeO_2$ thin film was employed here, the same effects are obtained if $ZrO_2$ or YSZ is employed.

Embodiment 3

FIG. 3 is a perspective view showing the outer appearance of the frequency filter according to the present embodiment. The frequency filter shown in FIG. 3 has a substrate 40. This substrate 40 is formed by sequentially stacking onto the (110) Si substrate 1 shown in FIG. 1, for example, a first oxide (SrO or MgO) layer 2, a second oxide layer ($SrTiO_3$) 3, a $KNbO_3$ piezoelectric thin film 4, and a protective layer ($SiO_2$ layer or AlN layer) 5, or by sequentially stacking onto the (100) Si substrate 11 shown in FIG. 2, a first oxide ($CeO_2$, $ZrO_2$ or YSZ) layer 12, a second oxide layer ($SrTiO_3$ layer) 13, a $KNbO_3$ piezoelectric thin film 14, and a protective layer ($SiO_2$ layer or AlN layer) 15.

IDT electrodes (i.e., Interdigital Transducers) 41 and 42 are formed to the upper surface of substrate 40. IDT electrodes 41 and 42 are formed of Al or an Al alloy, for example, and are designed to have a thickness that is $\frac{1}{100}^{th}$ of the pitch of the electrodes. Sound absorbing portions 43, 44 are formed to the upper surface of substrate 40 so that IDT electrodes 41, 42 will be interposed therebetween. Sound absorbing portions 41, 42 absorb the surface acoustic waves that propagate over the surface of substrate 40. High frequency signal source 45 is connected to IDT electrode 41 formed on substrate 40, and a signal line is connected to IDT electrode 42. Note that this IDT electrode 41 corresponds to the first electrode and IDT electrode 42 corresponds to the second electrode referred to in the present invention.

When a high frequency signal is output from high frequency signal source 45 in the above-described design, this high frequency signal is impressed on IDT electrode 41. As a result, a surface acoustic wave is generated on the upper surface of substrate 40. This surface acoustic wave propagates over the top surface of substrate 40 at a speed of approximately 5000 m/s. The surface acoustic waves propagating from IDT electrode 41 toward sound absorbing portion 43 are absorbed at sound absorbing portion 43. However, from among the surface acoustic waves propagating toward IDT electrode 42, only those surface acoustic waves with a specific frequency or specific band frequency determined according to the pitch and the like of IDT electrode 42 are converted to electric signals, and output to terminals 46a, 46b via the signal line. Note that the majority of the frequencies that are not the aforementioned specific frequency or specific band frequency are absorbed by sound absorbing portion 44 after passing through IDT electrode 42. In this way, of the electric signals supplied to IDT electrode 41 provided in the present embodiment's frequency filter, it is possible to obtain only surface acoustic waves of a specific frequency or specific band frequency (i.e., filtering is possible).

Embodiment 4

FIG. 4 is a perspective view showing the outer appearance of the oscillator according to an embodiment of the present invention. The oscillator shown in FIG. 4 has a substrate 50. This substrate 50 is formed by sequentially laminating onto the (110) Si substrate 1 shown in FIG. 1, for example, a first oxide (SrO or MgO) layer 2, a second oxide layer ($SrTiO_3$) 3, a $KNbO_3$ piezoelectric thin film 4, and a protective layer ($SiO_2$ layer or AlN layer) 5, or by sequentially laminating onto the (100) Si substrate 11 shown in FIG. 2, a first oxide ($CeO_2$, $ZrO_2$ or YSZ) layer 12, a second oxide layer ($SrTiO_3$ layer) 13, a $KNbO_3$ piezoelectric thin film 14, and a protective layer ($SiO_2$ layer or AlN layer) 15.

IDT electrode (i.e., Interdigital Transducer) 51 is formed on the upper surface of substrate 50. IDT electrodes 52 and 53 so that IDT electrode 51 is interposed therebetween. IDT electrodes 51~53 are formed of Al or an Al alloy, for example, and are designed to have a thickness that is $\frac{1}{100}^{th}$ of their respective pitches. High frequency signal source 54 is connected to one of the comb teeth-shaped electrodes 51a which form IDT electrode 51, while a signal line is connected to the other comb teeth-shaped electrode 51b. Note that this IDT electrode 51 corresponds to the present invention's electric signal impressing electrode, while IDT electrodes 52, 53 correspond to the present invention's resonating electrode for resonating a specific frequency or a specific band frequency of the surface acoustic waves generated by IDT electrode 51.

When a high frequency signal is output from high frequency signal source 54 in the above-described design, this high frequency signal is impressed on one of the comb teeth-shaped electrodes 51a of IDT electrode 51. As a result, surface acoustic waves are generated on the upper surface of substrate 50 that propagate toward IDT electrode 52 and toward IDT electrode 53. Note that the speed of this surface acoustic wave is approximately 5000 m/s. Of these surface acoustic waves, those surface acoustic waves of a specific frequency are reflected at IDT electrodes 52 and 53, and a standing wave is generated between IDT electrode 52 and IDT electrode 53. The surface acoustic wave of this specific frequency is repeatedly reflected at IDT electrodes 52, 53. As a result, specific frequencies or specific band frequencies are resonated and the amplitude increases. A portion of the surface acoustic waves of the specific frequency or the specific band frequency are extracted from the other comb teeth-shaped electrode 51b of IDT electrode 51, and the electric signal of the frequency (or the frequency of a certain band) corresponding to the resonance frequency between IDT electrode 52 and IDT electrode 53 can be extracted at terminals 55a and 55b.

Figure 5A:
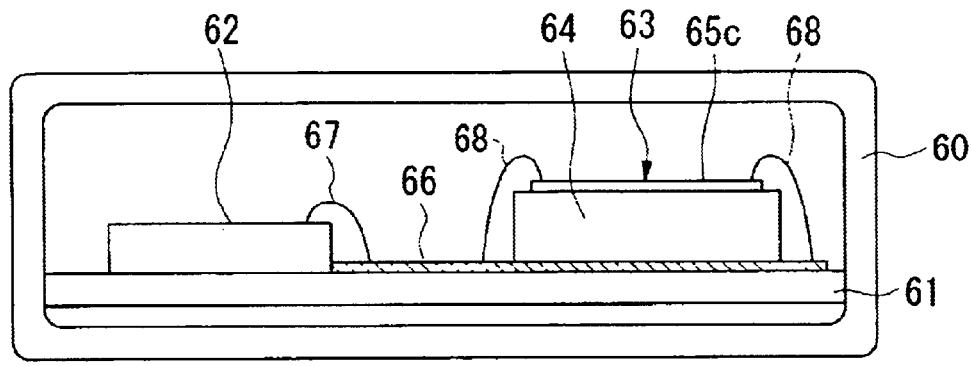
FIG. 5 is a view showing an example in which the surface acoustic wave device (oscillator) according an embodiment of the present invention is applied as a VCSO (Voltage Controlled SAW Oscillator).
Figure 5B:
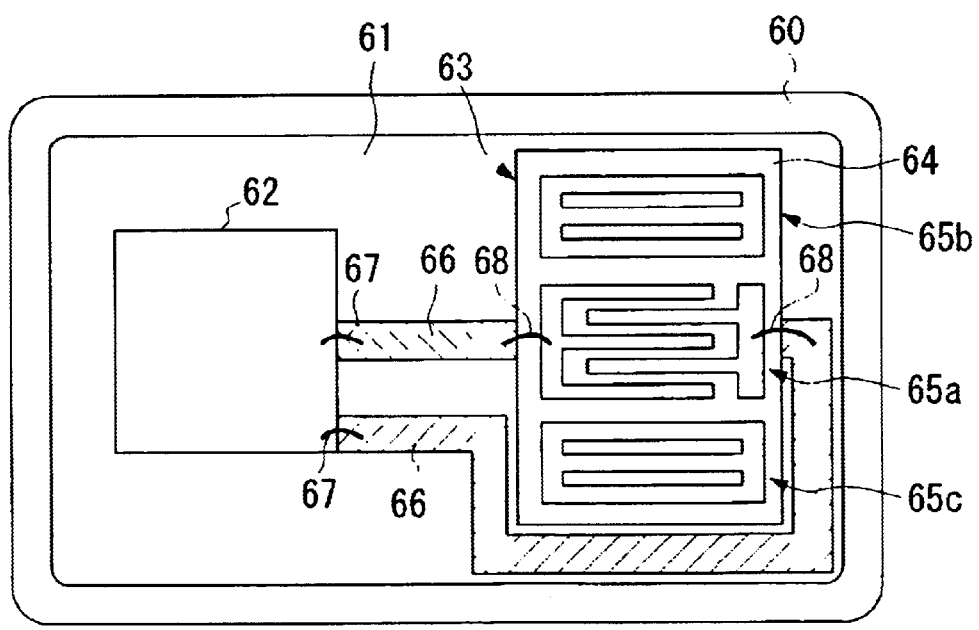

FIG. 5 is a view showing an example in which the surface acoustic wave device according to an embodiment of the present invention is employed as a VCSO (Voltage Controlled SAW Oscillator). FIG. 5A is a transparent view seen from the side, and FIG. 5B is a transparent view seen from above. The VCSO is housed inside a metallic (aluminum or stainless) box 60. The numeral 61 indicates a substrate. An IC (integrated circuit) and a oscillator 63 are housed on substrate 61. IC 62 controls the frequency impressed on oscillator 63 in response to the voltage input from an external circuit (not shown in the figures).

IDT electrodes 65a to 65c are formed on top of substrate 64 in oscillator 63, this structure being roughly equivalent to the oscillator shown in FIG. 4. Note that this substrate 64 is formed by sequentially laminating onto, for example, the (110) Si substrate 1 shown in FIG. 1, a first oxide (SrO or MgO) layer 2, a second oxide layer ($SrTiO_3$) 3, a $KNbO_3$ piezoelectric thin film 4, and a protective layer ($SiO_2$ layer or AlN layer) 5, or by sequentially laminating onto, for example, the (100) Si substrate 11 shown in FIG. 2, a first oxide ($CeO_2$, $ZrO_2$ or YSZ) layer 12, a second oxide layer ($SrTiO_3$ layer) 13, a $KNbO_3$ piezoelectric thin film 14, and protective layer ($SiO_2$ layer or AlN layer ) 15.

Wiring 66 is patterned onto substrate 61 in order to electrically connect IC 62 and oscillator 63. IC 62 and wiring 66 are, for example, connected by wire 67 which is metal wire or the like. Oscillator 63 and wiring 66 are connected by wire 68 which is metal wire or the like. Thus, IC 62 and oscillator 63 are electrically connected via wiring 66. Note that IC 62 and oscillator 63 can also be integrated onto the same Si substrate.

Figure 6:
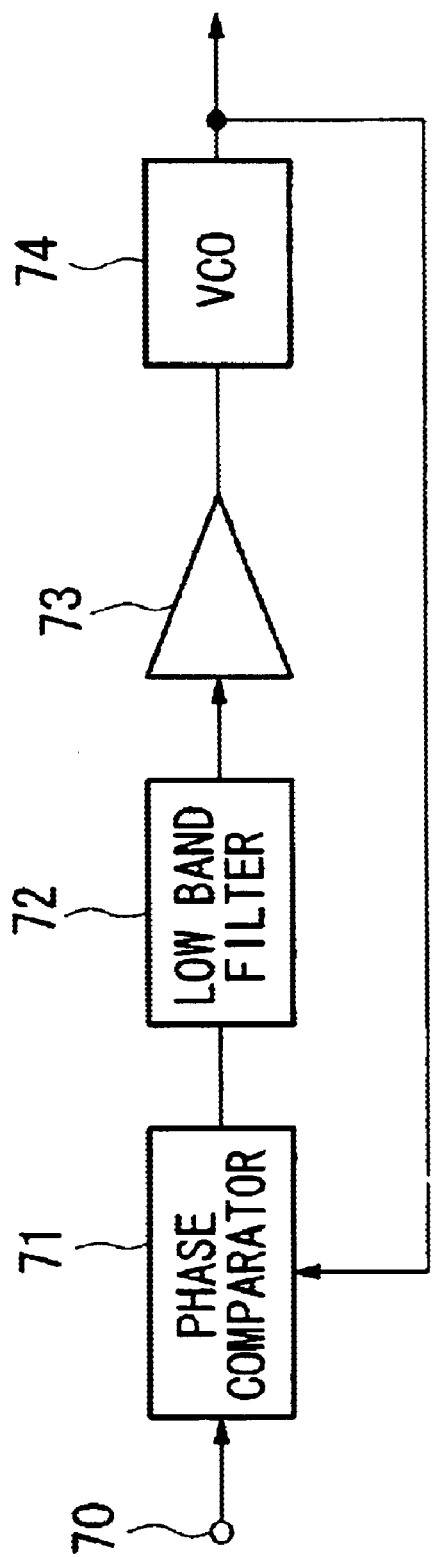
FIG. 6 is a block diagram showing the basic structure of a PLL circuit.

The VCSO shown in FIG. 5 can be employed as a VCO (Voltage Controlled Oscillator) for the PLL circuit shown in FIG. 6, for example. The PLL circuit will now be briefly explained. FIG. 6 is a block diagram showing the basic structure of a PLL circuit. As shown in FIG. 6, the PLL circuit consists of a phase comparator 71, low band filter 72, amplifier 73 and VCO 74.

Phase comparator 71 compares the phase (or frequency) of the signal input from input terminal 70 and the phase (or frequency) of the signal output from VCO74, and outputs an error voltage signal, the value of which is set according to the difference between the aforementioned signals. Low band filter 72 transmits only the low frequencies at the position of the error voltage signal output from phase comparator 71, and amplifier 73 amplifies the signal output from low band filter 72. VCO 74 is an oscillator circuit in which the oscillation frequency is continuously changed within a region, corresponding to the voltage value input. The aforementioned PLL circuit operates so as to decrease the difference between the phase (or frequency) input from input terminal 70 and the phase (or frequency) of the signal output from VCO 74, and synchronizes the frequency of the signal output from VCO 74 with the frequency of the signal input from input terminal 70. When the frequency of the signal output from VCO 74 is synchronized with the frequency of the signal input from input terminal 70, it is matched to the signal input from input terminal 70 after excluding a specific phase difference, and a signal is output which conforms to the changes in the input signal.

Embodiment 5

Figure 7:
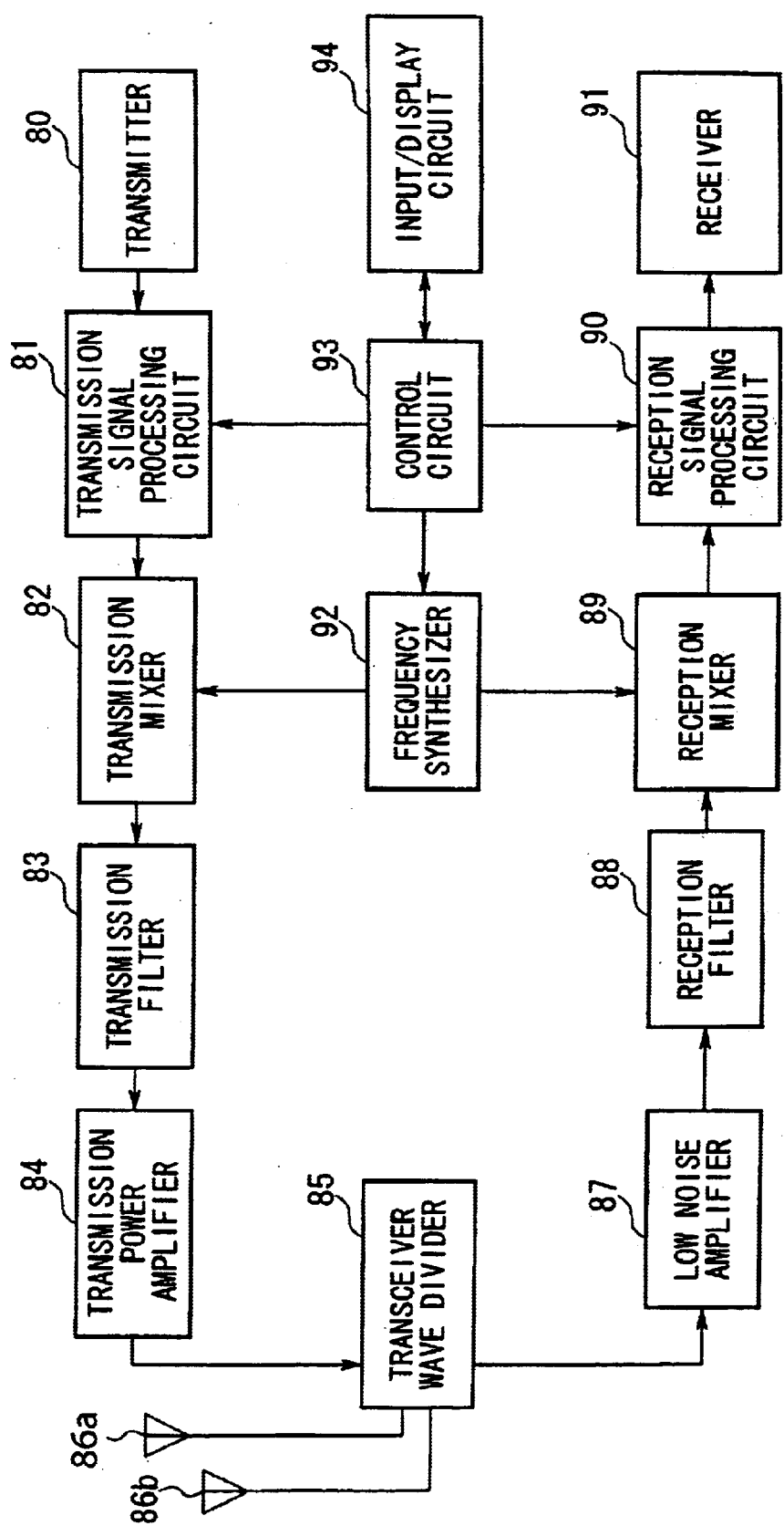
FIG. 7 is a block diagram showing the electric structure of an electronic circuit according to an embodiment of the present invention.
Figure 8:
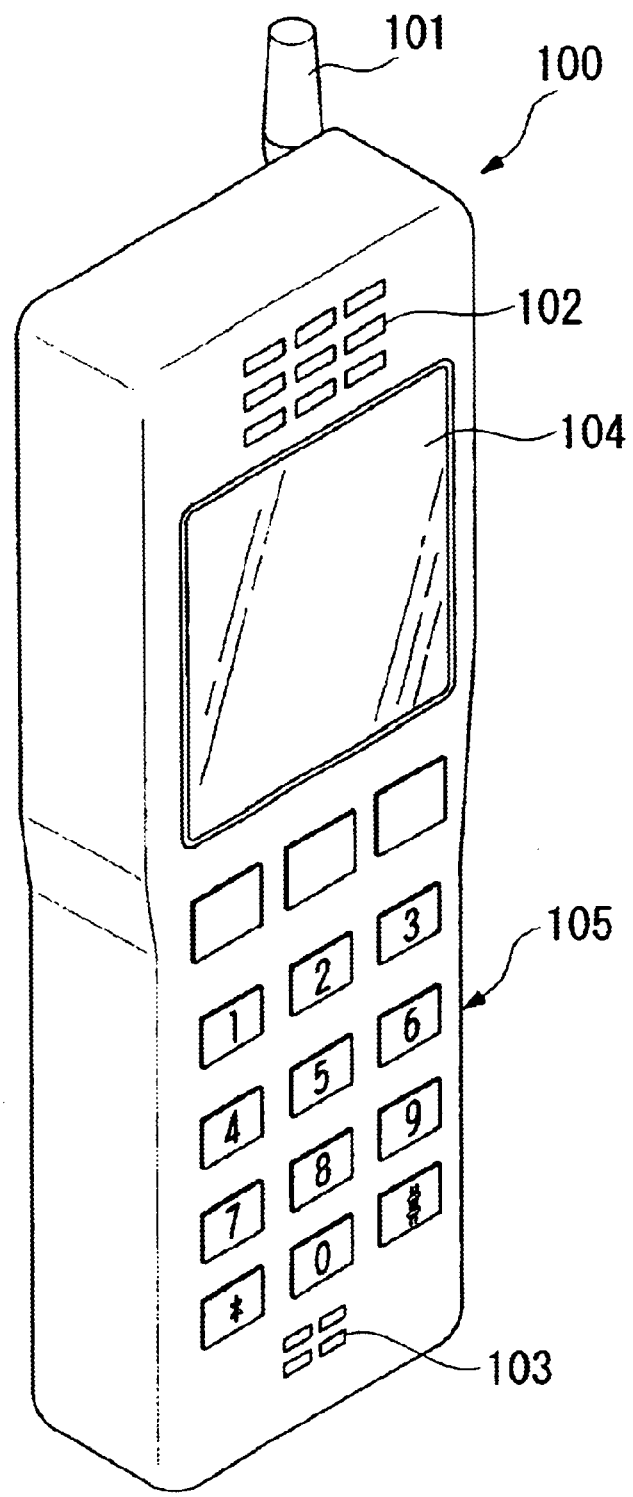
FIG. 8 is a perspective view showing an example of the external appearance of a cellular telephone as one type of electronic device according to an embodiment of the present invention.

FIG. 7 is a block diagram showing the electrical structure of an electronic circuit according to an embodiment of the present invention. Note that the electronic circuit in FIG. 7 is one that is provided inside cellular telephone 100 shown in FIG. 8, for example. FIG. 8 is a perspective view showing an example of the external appearance of the cellular phone which is offered here as one example of an electronic device according to an embodiment of the present invention. Cellular telephone 100 shown in FIG. 8 consists of an antenna 101, receiver 102, transmitter 103, liquid crystal display 104, operating buttons 105, and the like.

The electronic circuit shown in FIG. 7 has the basic structure of an electronic circuit provided inside cellular telephone 100 shown in FIG. 8, and is composed of transmitter 80, transmission signal processing circuit 81, transmission mixer 82, transmission filter 83, transmission power amplifier 84, transceiver wave divider 85, antennas 86a, 86b, low noise amplifier 87, reception filter 88, reception mixer 89, reception signal processing circuit 90, receiver 91, frequency synthesizer 92, control circuit 93, and input/display circuit 94. Note that cellular telephones currently in use have a more complicated circuit structure due to the fact that they perform frequency converting processes multiple times.

Transmitter 80 can be realized with a microphone which converts sound wave signals into electric signals, for example, and may be equated with transmitter 103 in the cellular telephone 100 shown in FIG. 8. Transmission signal processing circuit 81 is a circuit for performing such processing as D/A conversion, modulation, etc. on the electric signal output from transmitter 80. Transmission mixer 82 mixes the signal output from transmission signal processing circuit 81 using the signal output from frequency synthesizer 92. Note that the frequency of the signal supplied to transmission mixer 82 is 380 MHz, for example. Transmission filter 83 permits passage of only those signals of the required frequency from among the intermediate frequencies (IF), and cuts the unneeded frequency signals. Note that the signal output from transmission filter 83 is converted to an RF signal by a converting circuit not shown in the figures. The frequency of this RF signal is 1.9 GHz for example. Transmission power amplifier 84 amplifies the power of the RF signal output from transmission filter 83 and outputs this amplified result to transceiver wave divider 85.

Transceiver wave divider 85 outputs the RF signal output from transmission power amplifier 84 to antennas 86a, 86b, and transmits the signal in the form of radio waves from antennas 86a, 86b. Transceiver wave divider 85 divides the reception signal received by antennas 86a, 86b, and outputs the result to low noise amplifier 87. Note that the frequency of the reception signal output from transceiver wave divider 85 is, for example, around 2.1 GHz. Low noise amplifier 87 amplifies the reception signal from transceiver wave divider 85. Note that the signal output from low noise amplifier 87 is converted to an intermediate signal (IF) by converting circuit which is not shown in the figures.

Reception filter 88 permits passage of only those signals of the required frequency from among the intermediate frequencies (IF) that were converted by a converting circuit not shown in the figures, and cuts unnecessary frequency signals. Reception mixer 89 employs the signal output from frequency synthesizer 92 to mix the signals output from transmission signal processing circuit 81. Note that the intermediate frequency supplied to reception mixer 89 is, for example, around 190 MHz. Reception signal processing circuit 90 performs such processing as A/D conversion, modulation, etc., to the signal output from reception mixer 89. Receiver 91 is realized by means of a small speaker which converts electric signals into sound waves, for example, and corresponds to receiver 102 in cellular telephone 100 shown in FIG. 8.

Frequency synthesizer 92 is a circuit for generating the signal (at a frequency of 380 MHz, for example) supplied to transmission mixer 82 and the signal (at a frequency of 190 MHz, for example) supplied to reception mixer 89. Frequency synthesizer 92 is provided with a PLL circuit for generating a signal at 760 MHz for example. Frequency synthesizer 92 divides the signal output from this PLL circuit and generates a 380 MHz frequency signal, for example, and then further divides this signal to generate a 190 MHz signal. Control circuit 93 controls transmission signal processing circuit 81, reception signal processing signal 90, frequency synthesizer 92, and input/display circuit 94, thereby controlling the overall operation of the cellular telephone. Input/display circuit 94 displays the device status to the user of cellular telephone 100 shown in FIG. 8, and is provided for the user to input directions. This input/display circuit 94 corresponds to liquid crystal display 104 and operating buttons 105 on cellular telephone 100 shown in FIG. 8.

In an electronic circuit of the above-described design, the frequency filter shown in FIG. 3 is employed as transmission filter 83 and reception filter 88. The frequency that is filtered (i.e., the frequency which is permitted to pass through the filter) is set separately at transmission filter 83 and reception filter 88 in response to the required frequency in the signal output from transmission mixer 82 and the required frequency at reception mixer 89. The PLL circuit that is provided within frequency synthesizer 92 is provided with the oscillator shown in FIG. 4 or the oscillator (VCSO) shown in FIG. 5 as VCO 74 of the PLL circuit shown in FIG. 6.

Embodiment 6

FIG. 8 is a perspective view of a cellular telephone in one embodiment of the present invention. In this figure, the numeral 100 indicates a cellular telephone, 101 is an antenna, 102 is a receiver, 103 is a transmitter, 104 is a liquid crystal display, and 105 is an operating button.

The surface acoustic wave device, frequency filter, oscillator, electronic circuit, and electronic device according to the present invention's embodiments were explained above. However, the present invention is not limited to the above-described embodiments, but rather a variety of modifications may be freely made within the scope of the invention. For example, the preceding embodiments were explained using a cellular telephone as an example of an electronic device and an electronic circuit provided inside the cellular telephone as an example of an electronic circuit. However, the present invention is not limited to a cellular telephone. Rather, the present invention may be applied to a variety of mobile communications devices and their internal electronic circuits.

Furthermore, the present invention is not limited to mobile communications devices. It may also be applied to stationary communications devices such as tuners for receiving BS and CS transmissions. Nor is the present invention limited to communications devices employing radio waves propagating through air as the communications carrier. Rather, the present invention may also be applied to electronic devices and their internal circuitry, such as HUB, which employ high-frequency signals propagating through a co-axial cable or optical signals propagating through an optical cable.

As described above, the present invention provides a surface acoustic wave device that employs a (110) or (100) silicon substrate and a $KNbO_3$ piezoelectric thin film, wherein a first oxide thin film layer is formed on top of the silicon substrate, a second oxide thin film layer is formed on top of the first oxide thin film layer, a $KNbO_3$ piezoelectric thin film is formed on top of the second oxide thin film layer, and a thin film comprising an oxide or nitride is formed on top of the $KNbO_3$ piezoelectric thin film. As a result, the first oxide thin film layer and the second oxide thin film layer can be made to undergo epitaxial growth in order on top of the Si substrate, and a high-quality $KNbO_3$ epitaxial thin film can be formed on top of the aforementioned second oxide thin film layer. Accordingly, a surface acoustic wave device can be provided that is advantageous with respect to cost and capacity for mass production, and which is stable and has a high $k^2$.

In addition, this surface acoustic wave device can be employed to provide a frequency filter, oscillator, electronic circuit, and electronic device that are superior with respect to their energy conserving properties.

The entire disclosures of Japanese Patent Application Nos. 2001-081349 filed Mar. 21, 2001, 2001-081350 filed Mar. 21, 2001, and 2002-073090 filed Mar. 15, 2002 are incorporated by reference herein.

What is claimed is:

1. A surface wave device comprising:
   one of a (110) silicon substrate and a (100) silicon substrate;
   a first oxide thin film layer on said substrate formed from one of strontium oxide and magnesium oxide;
   a second oxide thin film layer on said first oxide thin film layer;
   a potassium niobate piezoelectric thin film on said second oxide thin film layer; and
   a protective thin film on said potassium niobate piezoelectric thin film, said protective thin film consisting of one of oxide and nitride.

2. The device of claim 1, wherein said potassium niobate piezoelectric thin film has a (010) orientation.

3. The device of claim 1, wherein said substrate comprises said (100) silicon substrate and said first oxide thin film layer further comprises one of cerium oxide, zirconium oxide, and yttria-stabilized zirconia.

4. The device of claim 1, wherein said second oxide thin film layer further comprises strontium titanate.

5. A surface acoustic wave device having a (100) silicon substrate and a potassium niobate piezoelectric thin film, characterized in the provision of said silicon substrate, a first oxide thin film layer formed on top of said silicon substrate, a second oxide thin film layer formed on top of said first oxide thin film layer, said potassium niobate piezoelectric thin film formed on top of said second oxide thin film layer, and a protective thin film comprising oxide or nitride formed on top of said potassium niobate piezoelectric thin film.

6. A surface acoustic wave device according to claim 5, characterized in that said potassium niobate piezoelectric thin film has a (010) orientation.

7. A surface acoustic wave device according to claim 5, characterized in that said first oxide thin film layer is cerium oxide, zirconium oxide, or yttria-stabilized zirconia.

8. A surface acoustic wave device according to claim 5, characterized in that said second oxide thin film layer is formed from strontium titanate.

9. A surface acoustic wave device having a (110) silicon substrate and a potassium niobate piezoelectric thin film, characterized in the provision of said silicon substrate, a first oxide thin film layer formed from one of strontium oxide and magnesium oxide formed on top of said silicon substrate, a second oxide thin film layer formed on top of said first oxide thin film layer, said potassium niobate piezoelectric thin film formed on top of said second oxide thin film layer, and a protective thin film comprising oxide or nitride formed on top of said potassium niobate piezoelectric thin film.

10. An oscillator characterized in the provision to a surface acoustic wave device according to claim 9, of an electric signal impressing electrode, which is formed on top of said protective thin film or said piezoelectric thin film and which generates a surface acoustic wave on said piezoelectric thin film from the impressed electric signal; and a resonating electrode, which is formed on top of said protective thin film or said piezoelectric thin film and which resonates a specific frequency or specific band frequency of the surface acoustic waves that are generated by said electric signal impressing electrode.

11. An electronic circuit characterized in the provision of the oscillator according to claim 10, and an electric signal supplying element for impressing said electric signal on said electric signal impressing electrode provided in said oscillator; wherein said electronic circuit selects specific frequencies from the frequencies of said electric signal or converts said electric signal to specific frequencies, or applies specific modulation to the electric signal and carries out specific demodulation or specific wave detection.

12. An electronic device characterized in the provision of the electronic circuit according to claim 11.

13. An electronic device characterized in the provision of the oscillator according to claim 10.

14. A surface acoustic wave device according to claim 9, characterized in that said potassium niobate piezoelectric thin film has a (010) orientation.

15. A surface acoustic wave device according to claim 9, characterized in that said second oxide thin film layer is formed from strontium titanate.

16. A frequency filter characterized in the provision to a surface acoustic wave device according to claim 9, of a first electrode, which is formed on top of said protective thin film or said piezoelectric thin film; and a second electrode which is formed on top of said protective thin film or said piezoelectric thin film; said second electrode resonating at a specific frequency or at a specific band frequency of the surface acoustic waves that are produced in said piezoelectric thin film from an electric signal impressed by said first electrode, and converting this resonance to an electric signal.

17. An electronic device characterized in the provision of the frequency filter according to claim 16.

* * * * *